United States Patent [19]
Wittstruck

[11] Patent Number: 5,652,551
[45] Date of Patent: Jul. 29, 1997

[54] METHOD FOR HIGH FREQUENCY DEVICE OPERATION WITH HIGH TEMPERATURE AND RADIATION HARD CHARACTERISTICS

[75] Inventor: Richard H. Wittstruck, Howell, N.J.

[73] Assignee: The United States of America as represented by the Secretary of the Army, Washington, D.C.

[21] Appl. No.: 670,055

[22] Filed: Jun. 25, 1996

[51] Int. Cl.$^6$ .................................................. H03B 9/12
[52] U.S. Cl. .............................. 331/107 R; 331/108 C; 257/76
[58] Field of Search .................. 331/107 R, 107 DP, 331/107 P, 107 SL, 107 C, 108 C; 257/76–78

[56] References Cited

U.S. PATENT DOCUMENTS

| | | | |
|---|---|---|---|
| 4,352,115 | 9/1982 | Moutou et al. | 331/107 R X |
| 5,479,028 | 12/1995 | Tomioka et al. | 257/76 |
| 5,530,267 | 6/1996 | Brandle, Jr. et al. | 257/76 |

*Primary Examiner*—David Mis
*Attorney, Agent, or Firm*—Michael Zelenka; William H. Anderson

[57] ABSTRACT

Micro-scale and nano-scale devices which achieve high frequency signals using materials having increased electron saturation velocity. These devices have frequencies in the terahertz range with high temperature and radiation hard characteristics. The transit time device includes a substrate, a buffer layer and an epitaxial layer made of a material in the 43 m and 6 mm crystallographic point groups and associated alloys, and at least two contacts on the device. In operation, one contact is forward biased and the other is reversed biased. Applications for this devices include transit-time-based oscillators for use in military and civilian radar receivers, logic devices, burglar alarm and proximity alarm systems.

26 Claims, 1 Drawing Sheet

METHOD FOR HIGH FREQUENCY DEVICE OPERATION WITH HIGH TEMPERATURE AND RADIATION HARD CHARACTERISTICS

GOVERNMENT INTEREST

The invention described herein may be manufactured, used, sold, imported and/or licensed by or for the United States Government without the payment to me of any royalty thereon.

FIELD OF THE INVENTION

The present invention relates to micro-scale and nano-scale devices. More particularly, the invention pertains to achieving high frequency signals using materials having increased electron saturation velocity. The use of such materials together with submicron scale and nano-scale device processing techniques affords devices having frequencies up to and including the terahertz band with high temperature and radiation hard characteristics. Such devices include transit-time-based oscillators for use in military and civilian radar receivers, logic devices, burglar alarm and proximity alarm systems.

BACKGROUND OF THE INVENTION

It is known in the art of microwave generation that transit-time, transferred electron and field effect transistor devices are efficient sources of microwave energy. Large signal behavior of transit-time devices was postulated in the late 1960's and Si and GaAs devices based on this theory were demonstrated in the late 1970's and early 1980's and have been more fully described in such treatises as "Physics of Semiconductor Devices," Sze et al, Wiley Interscience, 1981. The fundamental features common to these devices is the direct proportionality between the operating frequency and saturation velocity, and the inverse proportionality between frequency and depletion region width.

Specific examples of these transit time devices are IMPATT (impact ionization avalanche and transit time device) diodes and a BARITT (barrier inject transit time device) diodes. IMPATT and BARITT diodes are typically used as high frequency devices which amplify high frequency waves into high power waves or generate an oscillation of high frequency waves with high power. IMPATT diodes typically include an n+ type (or p+ type) semiconductor layer, a less doped semiconductor layer, an n-type (or p-type) semiconductor layer and a p+ type (or n+ type) semiconductor layer, all of which make a strata in this order. Electrodes are fitted on both ends (n+ type and p+ type of layers) of the strata. In operation, a reverse bias voltage is applied to the diode, that is, the electrode of the n+ type layer is connected to the positive terminal of an electric power source, and the electrode of the p+ type layer is connected to the negative terminal of the power source. This reverse bias voltage induces a carrier avalanche in the less doped semiconductor layer near the n-type layer. The electrons generated by the avalanche run through the less doped semiconductor layer to the n+ type layer with saturated velocity. This phenomenon induces negative resistance in the diode. The occurrence of negative resistance enables the diode to generate microwave oscillation. A typical IMPATT diode has a pn-junction. But there are other types of IMPATT diodes in which the pn-junction is replaced by a Schottky junction between a metal and a semiconductor.

BARITT diodes typically have a structure in which a metal layer, a p-type layer (or n-type layer) of semiconductors and a metal layer make strata in this order. One type of junction between the metal and one semiconductor layer is a Schottky junction. Similar to IMPATT diodes, when a reverse bias voltage is applied to the diode, majority carriers are injected to the semiconductor layer. The action of the majority carriers generates microwave oscillation. Also like IMPATT diodes BARITT diodes can have a pn-junction instead of the Schottky junction between the metal and the semiconductor.

The semiconductor material of these high frequency devices (IMPATT and BARIT diodes) has in the past been typically silicon or gallium arsenide. Other semiconductor materials have not been used as the material of choice for these high frequency devices so far, although diamond has been shown to lower the heat in such transit time devices based on silicon and gallium arsenide. Such a device made from diamond is disclosed in U.S. Pat. No. 5,243,119, issued to Shiomi et al on Sep. 7, 1993.

Unfortunately, known transit-time oscillator devices based on silicon and gallium arsenide are, at best, capable of generating only gigahertz range frequency signals. Therefore, it would be desirable to produce transit-time oscillator devices capable of generating terahertz range frequency signals.

SUMMARY OF THE INVENTION

Accordingly, one object of the present invention is to provide transit time device that are capable of terahertz frequencies.

It is another object of the present invention to provide such a device which can operate at high temperatures and which have radiation hard characteristics.

These and other object of the invention are acheived by the use of a 43 m and 6 mm crystallographic point group member material and associated alloys thereof such as silicon carbide and Group III nitride materials which exhibit increased electron saturation velocities, in excess of $2 \times 10^{+7}$ cm/s, coupled with the use of submicron device processing yielding depletion regions of approximately $10^{-7}$ m. By using these materials and processes, transit time devices may be fabricated that are capable of generating terahertz frequency signals. Additionally, in using these materials, the crystalline structure of these materials with their intrinsic wide energy band gaps (>2 eV) will make these devices relatively impervious to irradiation. Moreover, the high thermal conductivity (5–20 watts/cm°K) of these materials affords device operation in high ambient temperature environments. Therefore, the present invention provides an improved class of devices, such as IMPATT and BARITT devices, which achieve high temperature, high frequency, radiation hard operation. The present invention can be configured in any number of configurations, such as MSM, p-n-i-p, p-n-p and p-n-metal structures.

Specifically, the invention provides a transit-time oscillator which includes a substrate of semi-insulating material or semi-conducting material of a first conductivity type; a buffer layer on the substrate comprising a material selected from the group consisting of 43 m and 6 mm crystallographic point group members and alloys thereof which have a high doping of a second conductivity type; an epitaxial layer on the buffer layer comprising a material selected from the group consisting of 43 m and 6 mm crystallographic point group members and alloys thereof which have a doping of a second conductivity type in an amount different than the doping of the buffer layer; a first electrical contact on the epitaxial layer; and a second electrical contact on the buffer layer spaced from the epitaxial layer.

In operation, this transit time oscillator is forward biased with a D.C. signal to the first electrical contact and then a reverse bias D.C. signal is applied to the second electrical contact which results in the propagation of oscillation signals at the second electrical contact.

BRIEF DESCRIPTION OF THE DRAWINGS

These and other objects, features, and details of the invention will become apparent in light of the ensuing detailed disclosure, and particularly in light of the drawing wherein: The FIGURE shows a schematic cross-sectional view of an oscillator structure according to the invention.

DETAILED DESCRIPTION

Figure 1:
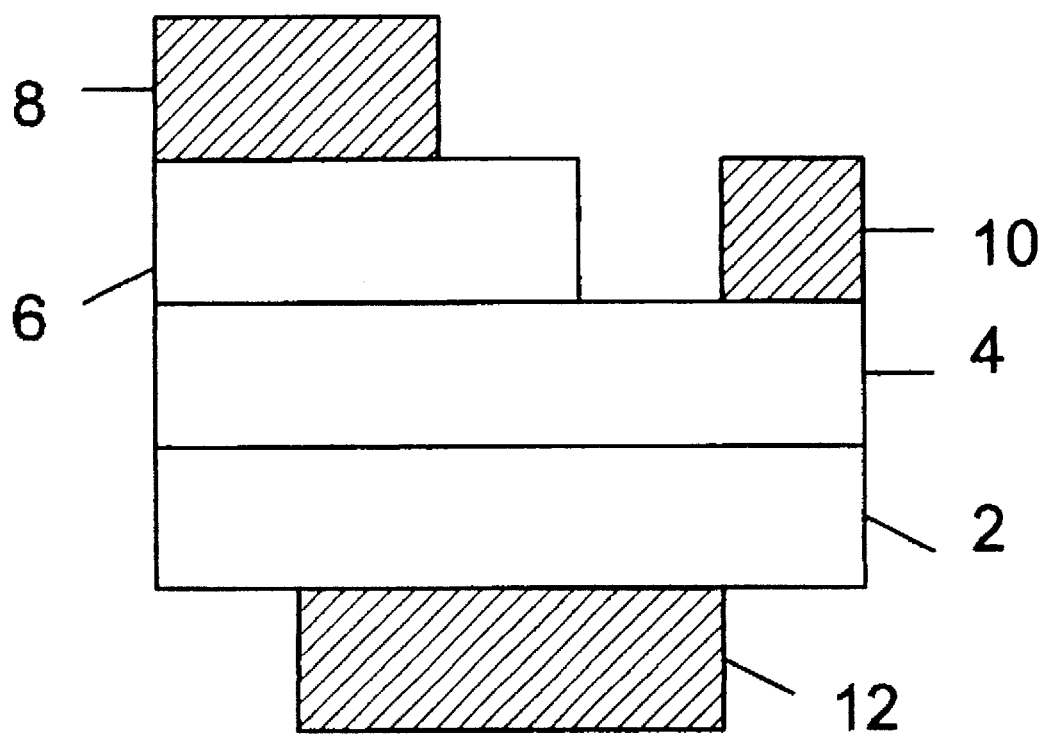

The invention provides a single epitaxial layer, transit-time microwave oscillator device capable of generating signals up to and including the terahertz frequency range. In one preferred embodiment, the oscillating signals have frequencies in the range of from about 500 to about 999 GHz. In another preferred embodiment, the oscillating signals have frequencies in the range of at least about 1 terahertz.

Referring to the FIGURE, there is shown a cross-sectional view of the preferred oscillator structure according to the invention. It comprises a substrate 2 of semi-insulating material or semi-conducting material of a first conductivity type. Suitable substrate materials include silicon carbide, gallium nitride, gallium aluminum nitride, silicon, gallium phosphide, lithium metagalate, lithium metaaluminate, sapphire, and scandium nitride. Attached to the substrate is a buffer layer 4. The buffer layer comprises a semiconductor material which is either a cubic 43 m or hexagonal 6 mm crystallographic point group member or an alloy thereof, according to Hermann-Mauguin notation. In the preferred embodiment, the buffer layer comprises a silicon carbide or Group III nitride semiconductor material having a high doping of a second conductivity type. Suitable materials for the buffer layer non-exclusively include binary, tertiary and quaternary Group III nitrides such as aluminum nitride, thallium nitride, boron nitride, indium nitride, gallium nitride and aluminum gallium nitride. On the buffer layer is an epitaxial layer 6 which also comprises the same type of semiconductor material as the buffer layer, but is doped with a different doping of a second conductivity type than the doping of the buffer layer.

In using these wide bandgap materials as the buffer and epitaxial layers, terahertz frequencies are now possible. This is true because the fundamental common relationship amongst these groups of materials is the direct proportionality between the operating frequency and the saturation velocity $V_{sat}$. Another underpinning relation is the inverse proportionality between frequency and the depletion region width. Therefore, because these materials exhibit saturation velocities in excess of $2 \times 10^7$ cm/s coupled with submicron device processing which can yield depletion regions of approximately $10^{-7}$ m, the present invention is capable of generating greater than terahertz frequencies.

These relations providing for this terahertz frequency capability is shown mathematically through the following large signal behavior relation:

$$f = \frac{\theta_d V_{sat}}{L},$$

where $\theta_d$ is drift angle, L is the depeletion region width, and $V_{sat}$ is the saturation velocity.

In the most preferred embodiment, buffer layer 4 is heavily doped with an $N^+$ type doping and epitaxial layer 6 is doped differently with an N type doping. In this case, the substrate is a semi-insulating material or a semi-conducting material of the P conductivity type. In an alternate embodiment, buffer layer 4 is heavily doped with an $P^+$ type doping and /epitaxial layer 6 is doped differently with a P type doping. In this case, the substrate is a semi-insulating material or a semi-conducting material of the N conductivity type. In the preferred embodiment, the $N^+$ type or $P^+$ type doping of the buffer layer is at least two orders of magnitude higher than the corresponding doping of the epitaxial layer or is linearly graded, in the lateral dimension, to the corresponding doping of the epitaxial layer.

Each of the buffer layer and the epitaxial layer are preferably grown on the substrate by molecular beam epitaxy or metal organic chemical vapor deposition techniques which are well known in the art. Each layer preferably has a thickness in the range of about 10 to about 500 Angstroms, with the preferred thickness range being from about 20 to about 200 Angstroms. The epitaxial deposition of the layers on the substrate is preferably conducted in an ultra-high vacuum system at a temperature of from about 350° C. to about 800° C. In order to form the epitaxial layer in desired areas on the buffer layer, either the epitaxial layer can be selectively grown or preferably a full epitaxial layer is formed and then lithographically etched by well-known techniques. For example, a photoresist layer may be laid down on the surface of the epitaxial layer. The photoresist layer is imagewise exposed to ultraviolet radiation through a mask and developed. The exposed areas are then removed leaving a positive photoresist image on the surface of the epitaxial layer. By removing the layer underlying exposed portions of the photoresist composition, corresponding portions of the epitaxial layer are uncovered. The uncovered epitaxial layer areas are then etched away. Then the balance of the photoresist is removed.

On the epitaxial layer is a first electrical contact 8. On the buffer layer, but spaced from the epitaxial layer is a second electrical contact 10. Optionally on the opposite side of the substrate 2 is a third electrical contact 12. Each of these contacts may comprise a suitable refractory metal, for example, aluminum, gold, silver, titanium, tungsten, molybdenum or an alloy thereof, among others.

First electrical contact 8 is deposited on top of the epitaxial layer, and a second electrical contact is deposited on the buffer layer spaced a distance away from the remaining epitaxial layer. Optionally, a third electrical contact is deposited on the opposite side of the substrate, separated from the buffer layer. Each of the electrical contacts may be applied by any convenient method including epitaxial deposition, sputtering or e-beam gun by methods all well known in the art. The electrical contacts typically have a thickness ranging from about 100 Angstroms to about 250 Angstroms. The first, second and third contacts may be ohmic, Schottky or diffused contacts.

In operation, the device is connected in an electric circuit, such as a tank circuit, wherein the first electrical contact is forward biased with a D.C. voltage of from about 1 to about 5 volts, preferably about 2 volts. The second electrical contact is reverse biased with a D.C. voltage of from about 1 to about 5 volts, preferably about 2 volts. In the preferred embodiment, the third electrical contact is grounded.

A forward biased active region is a critical condition for operation of the device. Forward biasing of the first electrical contact junction injects charge carriers into the epitaxial layer 6 and energizes initially encountered valence charge carriers in the epitaxial and buffer layers. A multiplication of charged carriers, such as electrons, energized by encounters with initially energized charge carriers diffuse toward the second electrical contact in a sufficient quantity to establish a current. The second electrical contact junction, which is reverse biased, attracts these charge carriers and sweeps them out of the device. Once a resonance peak is reached, a self induced regular oscillation commences since not only are charge carriers injected from the first electrical contact into the epitaxial layer, but a reverse stream of carriers may flow back to the first electrical contact. Because of the high saturation velocity of the epitaxial layer, charge carriers move back and forth quickly, i.e., at frequencies up to and including terahertz frequencies. The use of a highly or linearly graded doped buffer layer to separate the second electrical contact from the epitaxial layer and the first electrical contact serves to alleviate contact resistivity, and hence thermal degeneration, by lowering the Schottky barrier height which the charge carriers must overcome. It is within the ability of the skilled artisan to tailor contact resistivity by varying the level of doping in the buffer layer. In the preferred embodiment, the third electrical contact is used either to establish yet another electron flow path to a separate circuit or to ground. Grounding is preferred to establish an optimum operating environment for the device by eliminating current leakage, body effect spurious currents and buildup of heat in the substrate which reduces device efficiency.

The device according to the present invention is preferably connected in a tank circuit which receives the oscillating signal from the second electrical contact, maintains its frequency, amplifies it and calibrates it for use, such as in a radar receiver, logic device, burglar alarm or proximity alarm system.

What is claimed is:

1. A transit-time oscillator which comprises
    a substrate of semi-insulating material or semi-conducting material of a first conductivity type;
    a buffer layer on the substrate comprising a material selected from the group consisting of 43 m and 6 mm crystallographic point group members and alloys thereof which have a doping of a second conductivity type;
    an epitaxial layer on the buffer layer comprising a material selected from the group consisting of 43 m and 6 mm crystallographic point group members and alloys thereof which have a doping of said second conductivity type in an amount different than the doping of the buffer layer;
    a first electrical contact on the epitaxial layer; and
    a second electrical contact on the buffer layer spaced from the epitaxial layer.

2. The oscillator of claim 1 wherein the 43 m and 6 mm crystallographic point group members and alloys thereof comprise silicon carbide or a Group III nitride semiconductor material.

3. The oscillator of claim 1 further comprising a third electrical contact attached to the substrate.

4. The oscillator of claim 1 wherein the substrate comprises a material selected from the group consisting of silicon carbide, gallium nitride, gallium aluminum nitride, silicon, gallium phosphide, lithium metagalate, lithium metaaluminate, sapphire, and scandium nitride.

5. The oscillator of claim 2 wherein the Group III nitride comprises a material selected from the group consisting of aluminum nitride, thallium nitride, boron nitride, indium nitride, gallium nitride and aluminum gallium nitride.

6. The oscillator of claim 1 wherein the epitaxial layer is N doped and the buffer layer is $N^+$ doped.

7. The oscillator of claim 1 wherein the epitaxial layer is N doped and the buffer layer is linearly graded and doped N type.

8. The oscillator of claim 6 wherein the substrate comprises a semi-insulating material.

9. The oscillator of claim 6 wherein the substrate comprises a P doped material.

10. The oscillator of claim 1 wherein the epitaxial layer is P doped and the buffer layer is linearly graded and doped P type.

11. The oscillator of claim 1 wherein the epitaxial layer is P doped and the buffer layer is $P^+$ doped.

12. The oscillator of claim 9 wherein the substrate comprises a semi-insulating material.

13. The oscillator of claim 9 wherein the substrate comprises an N doped material.

14. The oscillator of claim 1 wherein the first and second electrical contacts independently comprise a refractory metal.

15. The oscillator of claim 1 wherein the first and second electrical contacts independently comprise a material selected from the group consisting of aluminum, gold, silver, titanium, tungsten, molybdenum and alloys thereof.

16. The oscillator of claim 3 wherein the third electrical contact comprises a refractory metal.

17. The oscillator of claim 3 wherein the third electrical contact comprises a material selected from the group consisting of aluminum, gold, silver, titanium, tungsten, molybdenum and alloys thereof.

18. An electric circuit which comprises:
    a transit-time oscillator which comprises a substrate of semi-insulating material or semi-conducting material of a first conductivity type;
    a buffer layer on the substrate comprising a material selected from the group consisting of 43 m and 6 mm crystallographic point group members and alloys thereof which have a doping of a second conductivity type;
    an epitaxial layer on the buffer layer comprising a material selected from the group consisting of 43 m and 6 mm crystallographic point group members and alloys thereof which have a doping of said second conductivity type in an amount different than the doping of the buffer layer;
    a first electrical contact on the epitaxial layer; and a second electrical contact on the buffer layer spaced from the epitaxial layer;
    an electrical connection attached to the a first electrical contact; and
    an electrical connection attached to the a second electrical contact.

19. The electric circuit of claim 18 wherein the transit-time oscillator further comprises a third electrical contact attached to the substrate and an electrical connection attached to the third electrical contact.

20. The electric circuit of claim 19 wherein the third electrical contact is electrically grounded.

21. The electric circuit of claim 18 wherein buffer layer is linearly graded and doped.

22. A method of generating oscillating signals which comprises the steps of:
    i) providing a transit-time oscillator which comprises a substrate of semi-insulating material or semi-conducting material of a first conductivity type; a buffer layer on the substrate comprising a material selected from the group consisting of 43 m and 6 mm crystallographic point group members and alloys thereof which have a doping of a second conductivity type; an epitaxial layer on the buffer layer comprising a material selected from the group consisting of 43 m and 6 mm crystallographic point group members and alloys thereof which have a doping of said second conductivity type in an amount different than the doping of the buffer layer; a first electrical contact on the epitaxial layer; and a second electrical contact on the buffer layer spaced from the epitaxial layer;

ii) applying a forward bias D.C. signal to the first electrical contact; and iii) applying a reverse bias D.C. signal to the second electrical contact and propagating oscillation signals at the second electrical contact.

23. The method of claim 22 wherein the oscillating signals have frequencies in the range of from about 500 to about 999 GHz.

24. The method of claim 22 wherein the oscillating signals have frequencies in the range of at least about 1 terahertz.

25. The method of claim 22 wherein the transit-time oscillator further comprises a third electrical contact attached to the substrate wherein the third electrical contact is electrically grounded.

26. The method of claim 22 wherein the forward bias D.C. signal and the reverse bias D.C. signal range from about 1 to about 5 volts.

* * * * *